United States Patent
Wang

(10) Patent No.: US 10,317,801 B2
(45) Date of Patent: Jun. 11, 2019

(54) METHOD FOR FORMING PHOTOLITHOGRAPHIC PATTERN

(71) Applicant: Semiconductor Manufacturing International (Shanghai) Corporation, Shanghai (CN)

(72) Inventor: Hui Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/199,230

(22) Filed: Jun. 30, 2016

(65) Prior Publication Data

US 2017/0003596 A1  Jan. 5, 2017

(30) Foreign Application Priority Data

Jul. 1, 2015 (CN) .......................... 2015 1 0378617

(51) Int. Cl.
- *G03F 7/40* (2006.01)
- *G03F 7/20* (2006.01)
- *G03F 7/32* (2006.01)
- *G03F 7/38* (2006.01)
- *G03F 7/09* (2006.01)

(52) U.S. Cl.
CPC .............. *G03F 7/40* (2013.01); *G03F 7/091* (2013.01); *G03F 7/20* (2013.01); *G03F 7/322* (2013.01); *G03F 7/325* (2013.01); *G03F 7/38* (2013.01)

(58) Field of Classification Search
CPC . G03F 7/322; G03F 7/325; G03F 7/38; G03F 7/40; G03F 7/091
USPC ......................................... 430/325, 330, 436
See application file for complete search history.

(56) References Cited

U.S. PATENT DOCUMENTS

2015/0309415 A1* 10/2015 Bozano ................. G03F 7/0392
430/270.1

FOREIGN PATENT DOCUMENTS

CN      1789295 A    6/2006

OTHER PUBLICATIONS

Development of materials and processes for double patterning toward 32nm node 193nm Immersion lithography process, Tarutani et al, Proc. of SPIE vol. 6923 (2008), pp. 69230F-1 through 69230F-8.*

Shinji Tarutani et al., "Development of Materials and Processes for Double Patterning toward 32nm Node ArF Immersion Lithography", Journal of Photopolymer Science and Technology, 2008, vol. 21, No. 5, p. 685-690.

* cited by examiner

*Primary Examiner* — Daborah Chacko-Davis
(74) *Attorney, Agent, or Firm* — Anova Law Group, PLLC

(57) ABSTRACT

In accordance with some embodiments of the disclosed subject matter, a method for forming a photolithographic pattern is provided. The method comprises: providing a substrate with a negative photoresist layer formed on the substrate; performing an exposure process on a portion of the negative photoresist layer to form an exposed region, wherein a remaining portion of the negative photoresist layer is an unexposed region; performing a first developing process using a water-based developing solution to remove an upper portion of the exposed region, and to reveal a top surface and a side wall of the unexposed region; and performing a second developing process using an organic developing solution after the first developing process to remove the unexposed region and form the photolithographic pattern.

17 Claims, 3 Drawing Sheets

METHOD FOR FORMING PHOTOLITHOGRAPHIC PATTERN

CROSS-REFERENCES TO RELATED APPLICATIONS

This application claims the priority of Chinese patent application No. CN201510378617.1, filed on Jul. 1, 2015, the entire content of which is incorporated herein by reference.

TECHNICAL FIELD

The disclosed subject matter generally relates to semiconductor technology and, more particularly, relates to a method for forming a photolithographic pattern.

BACKGROUND

In the semiconductor integrated circuit (IC) fabrication, photolithography processes and etching processes are often processed repeatedly to form patterns on semiconductor substrates. An ordinary photolithography process can be carried out as following. First, a photoresist (PR) layer can be spin-coated on a silicon wafer. The silicon wafer coated with the photoresist layer can be selectively exposed to a certain light, such as an ultraviolet light, an X-ray, or an electron beam, etc. Going through a developing process, the photoresist layer that remains on the silicon wafer can form a photoresist pattern for protecting the covered area.

Since it is difficult to parse out a small-sized and hole-shaped pattern by one exposure using positive photoresists, negative photoresists are used in photolithography processes. A negative photoresist layer has a different optical characteristic compared to a positive photoresist layer. During exposure, a light curing reaction or a crosslinking reaction can occur in an exposed region of a negative photoresist layer. So during the developing process, the light-exposed region of the negative photoresist layer can be insoluble in development liquid.

However, as the critical dimensions of integrated circuits shrink, a photolithographic pattern formed by a negative photoresist layer may have defects in its shape and size.

BRIEF SUMMARY

In accordance with some embodiments of the disclosed subject matter, a method for forming a photolithographic pattern is provided. The method comprises: providing a substrate with a negative photoresist layer formed on the substrate; performing an exposure process on a portion of the negative photoresist layer to form an exposed region, wherein a remaining portion of the negative photoresist layer is an unexposed region; performing a first developing process using a water-based developing solution to remove an upper portion of the exposed region, and to reveal a top surface and a side wall of the unexposed region; and performing a second developing process using an organic developing solution after the first developing process to remove the unexposed region and form the photolithographic pattern.

In some embodiments, the water-based developing solution is a tetramethylammonium hydroxide aqueous solution.

In some embodiments, the tetramethylammonium hydroxide aqueous solution has a concentration from 0.1% to 3% by volume.

In some embodiments, a duration time of the first developing process is between 1 second and 100 seconds.

In some embodiments, a temperature of the tetramethylammonium hydroxide aqueous solution is between 22 degrees Celsius to 23 degrees Celsius.

In some embodiments, the negative photoresist layer has a thickness between 40 nm and 1000 nm.

In some embodiments, the upper portion of the exposed region has a thickness between 20 angstroms and 150 angstroms.

In some embodiments, the organic developing solution is an n-butanol solution.

In some embodiments, the n-butanol solution has a concentration from 0.5% to 10% by volume.

In some embodiments, the method further comprises performing a first heating process after the exposure process.

In some embodiments, a duration time of the first heating process is between 50 seconds and 120 seconds; and a temperature of the first heating process is between 100 degrees Celsius and 250 degrees Celsius.

In some embodiments, the method further comprises performing a first cooling process after the first heating process.

In some embodiments, a duration time of the first cooling process is between 30 seconds and 150 seconds; and a temperature of the first cooling process is between 22 degrees Celsius and 24 degrees Celsius.

In some embodiments, the method further comprises performing a first rinsing process after the first developing process and before the second developing process.

In some embodiments, the method further comprises performing a second rinsing process after the second developing process.

In some embodiments, the method further comprises performing a second heating process after the second rinsing process.

In some embodiments, the method further comprises performing a second cooling process after the second heating process.

In some embodiments, the photolithographic pattern comprises a via hole.

In some embodiments, the photolithographic pattern comprises a trench.

In some embodiments, the method further comprises forming an anti-reflective coating layer between the substrate and the negative photoresist layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
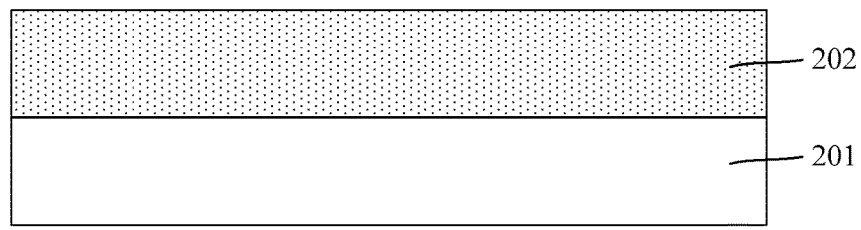
FIGS. 1-5 illustrate cross sectional structures of an exemplary photolithographic pattern corresponding to certain stages during its formation process in accordance with various disclosed embodiments.

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

In an existing photolithographic patterning process, a photolithographic pattern formed by a negative photoresist layer may have defects in both shape aspect and size aspect. For example, when a plurality of via holes are formed in a pattern of the photoresist layer through a photolithography process, some the via holes at certain locations may have too small sizes. Or at some locations where via holes are supposedly to be formed, no via hole is formed.

When using a negative photoresist layer to form a small-sized (e.g., less than 100 nm) lithographic pattern, such as a via hole, portions of the negative photoresist layer that need to be illuminated can be defined as an exposed region, portions of the negative photoresist layer that need not to be illuminated can be defined as an unexposed region.

During the exposure process, light acid on the surface of the exposed region is one of the reaction materials that involves in the light curing reaction or the crosslinking reaction. Because the surface of the negative photoresist layer receives relatively strong light intensity, some light acid on the surface of the exposed region may diffuse to the surface of the unexposed region. So the light curing reaction or crosslinking reaction may also occur on the surface of unexposed region during the exposure to form photoresist material that is insoluble in the developing solution.

When using the developing solution to develop the exposed photoresist layer, since a partial surface of the unexposed region is covered by photoresist material that is insoluble in the developing solution, and due to the small dimensions of the unexposed region, the photoresist material of the unexposed region may not be removed or may not be completely removed by the developing solution. Therefore, a formed photoresist pattern may have varied size variation, or a photoresist pattern may not be formed in position, which is harmful to the subsequent processes.

Accordingly, the disclosed subject matter provides a method for forming a photolithographic pattern. The disclosed method is directed to solve the problem set forth above or other problems in the art.

In accordance with some embodiments, the method can include: providing a substrate with a negative photoresist layer formed on the substrate; performing an exposure process on a portion of the negative photoresist layer to form an exposed region, wherein a remaining portion of the negative photoresist layer is an unexposed region; performing a first developing process using a water-based developing solution to remove an upper portion of the exposed region, and to reveal a top surface and a side wall of the unexposed region; and performing a second developing process using an organic developing solution after the first developing process to remove the unexposed region and form the photolithographic pattern.

Therefore, a developing dual mode can be used in the disclosed method. A water-based solution can be firstly used to lightly develop the entire surface of the photoresist film after exposure. After a top potion of the photoresist film being removed, an organic solvent can then be used to develop the remaining photoresist film. Thus the hole missing defect can be efficiently eliminated, and a process window can be improved.

FIGS. 1-5 illustrate cross sectional structures of an exemplary photolithographic pattern corresponding to certain stages during its formation consistent with various disclosed embodiments.

In the exemplary embodiments, the schematic diagrams may be enlarged disproportionally to more conveniently illustrate the specific details of interest, which should not limit the scope of the present invention. In addition, the actual fabrication processes may be performed to provide three dimensions of a length, a width and a depth.

Referring to FIG. 1, a substrate 201 is provided. A negative photoresist layer 202 is formed on the substrate 201.

In some embodiments, substrate 201 is a material to be implanted or a material to be etched.

In some embodiments, the substrate 201 can include any suitable semiconductor material. For example, substrate 201 can include one or more of silicon (Si), germanium (Ge), silicon germanium (GeSi), silicon carbide (SiC). As another example, substrate 201 can include silicon-on-insulator (SOI) or germanium-on-insulator (GOI). As yet another example, substrate 201 can include Group III-V compounds such as gallium arsenide, etc.

In some embodiments, the substrate 201 can be made by one or more of a dielectric layer material, a metal material, and a metal compound material. The dielectric layer material may be silicon dioxide, silicon nitride, silicon oxynitride, silicon carbide, or any other suitable dielectric material. The metal material may be W, Al, Cu, Ti, Ag, Au, Pt, Ni, or any other suitable metal material. The metal compound material may be TiN, TaN, TaC, TaSiN, WN, Wsi, or any other suitable metal compound material.

The negative photoresist layer 202 can be subsequently used to form a photoresist pattern, which can be used a mask for etching substrate 201 and/or implanting substrate 201.

The negative photoresist material layer 202 can include photosensitive resin, sensitizer, and solvent. The negative photoresist material can rapidly undergo light curing reaction or crosslinking reaction when being illuminated or exposed. The physical properties of the exposed negative photoresist material, especially the solubility and the affinity, can have significant changes.

A process for forming a negative photoresist layer 202 can be a spin-coating process. In some embodiments, a thickness of the negative photoresist layer 202 can be from 40 nm to 1000 nm.

In one embodiment, an anti-reflective coating layer can be formed between substrate 201 and negative photoresist layer 202.

Figure 2:
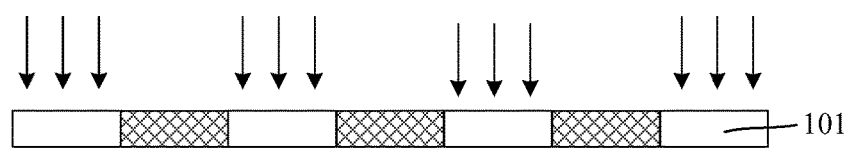
Figure 2:
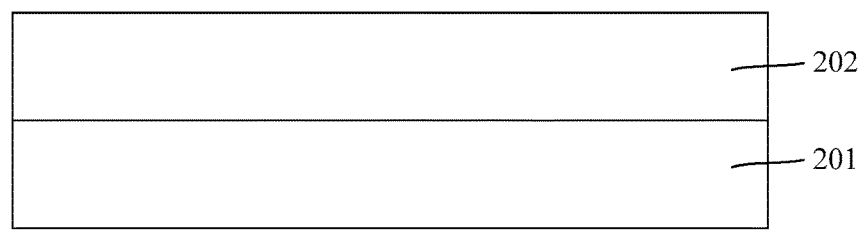
Figure 3:
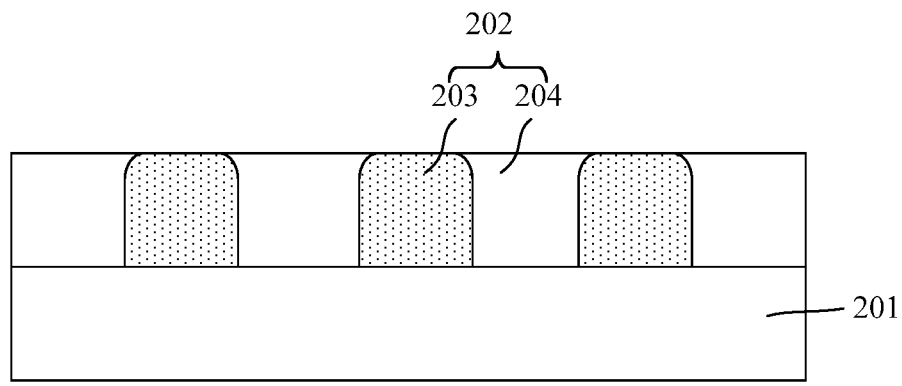

Referring to FIG. 2, and FIG. 3, an exposure process can be performed on the negative photoresist layer 202.

During exposure process, a masking layer 101 is located above the substrate 201. The exposure light can go through the masking layer 101 and reach the negative photoresist layer 202 on the substrate 201. The areas of negative photoresist layer 202 that are exposed by the exposure light can form exposed region 204, the areas of negative photoresist layer 202 that are unexposed can be unexposed region 203 as shown in FIG. 3.

Exposed region 204 of the negative photoresist layer 202 can undergo light curing reaction or crosslinking reaction during the exposure process. Thus the physical properties of exposed region 204 can be changed from the physical properties of unexposed region 203.

In some embodiments, a first heating treatment can be performed after the exposure process, and then a first cooling treatment can be performed.

A purpose of the first heating treatment is to complete the light curing reaction or crosslinking reaction of exposed region 204. Thus the photo acid can be further diffused, and the solvent including water in the negative photoresist layer 202 can be dried. A purpose of the first cooling treatment is to stop the light curing reaction or crosslinking reaction, and to cool the substrate.

In some embodiments, a temperature of the first heating treatment can be from 100 degrees Celsius to 250 degrees Celsius, and a duration time of the first heating treatment can be from 50 seconds to 120 seconds. A temperature of the first cooling treatment can be from 22 degrees Celsius to 24 degrees Celsius, and a duration time of the first cooling treatment can be from 30 seconds to 150 seconds.

During the exposure process, since the surface of the exposed region 204 receives relatively strong light intensity, some light acid on the surface of the exposed region 204 may be diffused to the surface of the unexposed region 203. So the light curing reaction or the crosslinking reaction may also occur on the surface of unexposed region 203 during the exposure to form photoresist material that is insoluble in the developing solution. Especially, the problem on the top edges of the unexposed region 203 can be more severe.

Therefore, referring to FIG. 3, the top surface and the top edges of the unexposed regions 203 can have photoresist material that is insoluble in a developing solution. For illustration purposes, the top edges (and the top surface) of the originally unexposed region 203 that later generate photoresist material from light curing reaction or crosslinking reaction are used to define exposure region 204.

Figure 4:
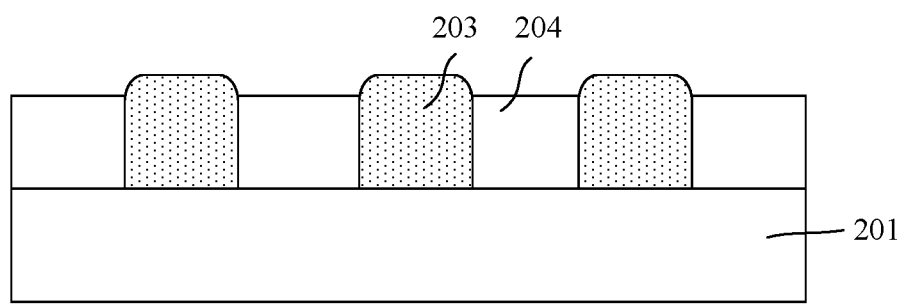

Referring to FIG. 4, using a water-based developing solution, a first developing process can be performed to remove an upper portion of the exposed region 204. So the top portions and the side walls of the non-exposed region 203 can be revealed.

The exposed region 204 has different physical characteristics compared to the non-exposed region 203. The photoresist material in the exposed region 204 generated from light curing reaction or crosslinking reaction can have a high solubility in the water-based developing solution. However, the material in the unexposed region 203 can have a low solubility in the water-based developing solution. So the water-based developing solution can remove an upper portion of the exposed region 204

As illustrated in FIG. 4, by removing the upper portion of the exposed region 204, the top portions and the side walls of the non-exposed region 203 can be revealed. Since the top portions and the side walls of the non-exposed region 203 are not covered by the photoresist material that is insoluble in the developing solution, a subsequent second developing process can cleanly remove the material in the non-exposed region 203 to form a photolithographic pattern that has a consistent size of the upper sidewall and the lower sidewall.

On one hand, a thickness of the removed upper portion of the exposed region 204 cannot be too thick. If the removed upper portion of the exposed region 204 is too thick, a thickness of the remaining negative photoresist layer may be limited. In that case, a masking effect of the negative photoresist layer in the subsequent etching process or ion implantation process may be reduced.

On the other hand, a thickness of the removed upper portion of the exposed region 204 cannot be too thin. If the removed upper portion of the exposed region 204 is too thin, the photoresist material on the top portions and the side walls of the non-exposed region 203 that is insoluble in the developing solution may not be effectively removed.

In some embodiments, a thickness of the removed upper portion of the exposed region 204 can have a range from 20 angstroms to 150 angstroms. This range can ensure the photoresist material on the top portions and the side walls of the non-exposed region 203 to be removed clearly, and ensure the remaining negative photoresist layer to have an effective masking effect.

In some embodiments, the water-based developing solution can be tetramethylammonium hydroxide (TMAH) aqueous solution, or any other suitable solution.

In some embodiments, a concentration of the TMAH aqueous solution cannot be too high. If the concentration of the TMAH aqueous solution is too high, a dissolution rate of the exposed region 204 may be too high to control the thickness of the upper portion of the exposed region 204 that is to be removed.

In some embodiments, a volume percentage of the concentration of the TMAH aqueous solution can be from 0.1% to 3%, a duration time of the first developing process can be from 1 second to 100 seconds, a temperature of the TMAH aqueous solution can be from 22 degrees Celsius to 23 degrees Celsius. These parameter ranges can ensure that the photoresist material on the top portions and the side walls of the non-exposed region 203 can be removed clearly, the thickness of the removed upper portion of the exposed region 204 can satisfy the technical requirements, and the unexposed region 203 can suffer small impact.

After the first developing process, a first rinsing process using deionized water can be performed. Then a baking process can be performed after the first rinsing process to prevent the residual water-based developing solution making an effect on a subsequent second developing process.

Figure 5:
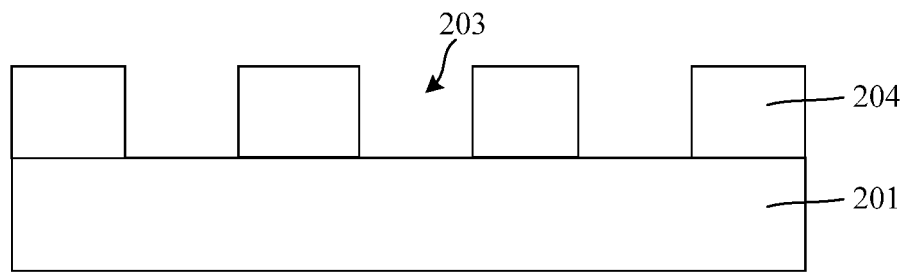

Referring to FIG. 5, the second developing process using organic developing solution can be performed to remove the unexposed region 203 and form a photoresist pattern 203.

The organic developing solution can be n-butanol solution, or any other suitable solution.

In some embodiments, a volume percent of a concentration of the n-butanol solution can be from 0.5% to 10%.

After the second developing process, a second rinsing process, a second heating treatment, and a second cooling treatment can be performed sequentially. In some embodiments, the second rinsing process can use deionized water. A temperature of the second heating treatment can be from 100 degrees Celsius to 150 degrees Celsius, and a duration time of the second heating treatment can be from 50 seconds to 120 seconds. A temperature of the second cooling treatment can be from 22 degrees Celsius to 24 degrees Celsius, and a duration time of the second cooling treatment can be from 30 seconds to 150 seconds.

In some embodiments, the photoresist pattern 203 can include a via hole or a trench.

It should be noted that, although not shown in the drawings, any suitable further processes can be performed after forming the photoresist pattern 203. For example, using the remaining negative photoresist layer as a mask, an ion implantation process or an etching process can be performed along the photolithographic pattern 203 on the substrate 201.

Figure 6:
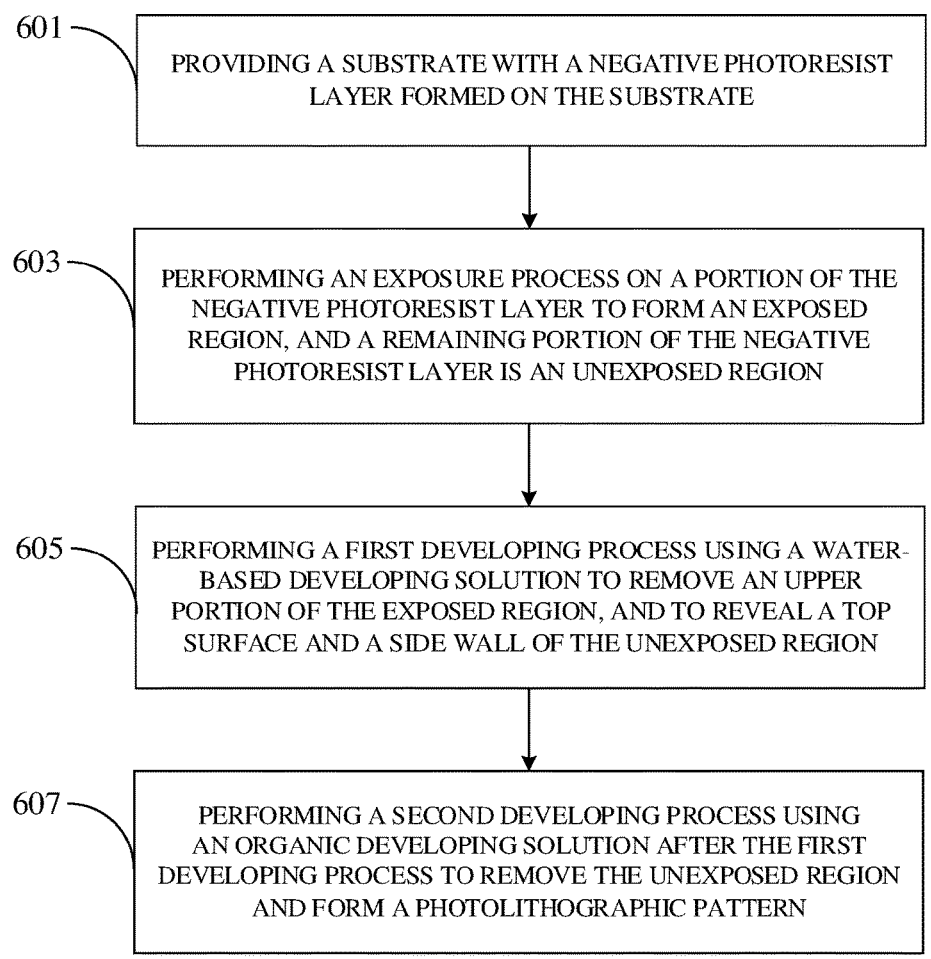
FIG. 6 illustrates a flow chart of an exemplary method for forming a photolithographic pattern in accordance with various disclosed embodiments.

Referring to FIG. 6, a flow chart of an exemplary method for forming a photolithographic pattern is shown in accordance with various disclosed embodiments. The method can include the following steps.

At Step 601, a substrate with a negative photoresist layer formed on the substrate can be provided.

At Step 603, an exposure process can be performed on a portion of the negative photoresist layer to form an exposed region, and a remaining portion of the negative photoresist layer is an unexposed region.

At Step 605, a first developing process can be performed by using a water-based developing solution to remove an upper portion of the exposed region, and to reveal a top surface and a side wall of the unexposed region.

At Step 607, a second developing process can be performed by using an organic developing solution after the first developing process to remove the unexposed region and form a photolithographic pattern.

It should be noted that, although not shown in FIG. 6, any suitable steps can be performed before or after a step illustrated in FIG. 6. For example, a first heating treatment and a first cooling treatment can be performed between Steps 603 and 605. As another example, a second heating treatment and a second cooling treatment can be performed after Step 607. As yet another example, an ion implantation process or an etching process can be performed after Step 607.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a method for forming a photolithographic pattern is provided.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for forming a photolithographic pattern, comprising:
   providing a substrate with a negative photoresist layer formed on the substrate;
   performing an exposure process on a portion of the negative photoresist layer to form an exposed region, wherein a remaining portion of the negative photoresist layer is an unexposed region;
   performing a first developing process using a water-based developing solution to remove an upper portion of the exposed region, and to reveal a top surface and a side wall of the unexposed region, wherein the removed upper portion of the exposed region has a thickness between 20 angstroms and 150 angstroms;
   performing a second developing process using an organic developing solution after the first developing process to remove the unexposed region and form the photolithographic pattern; and
   after the second developing process using the organic developing solution, performing a first rinsing process, a first heating process and a first cooling process sequentially.

2. The method of claim 1, wherein the water-based developing solution is a tetramethylammonium hydroxide aqueous solution.

3. The method of claim 2, wherein the tetramethylammonium hydroxide aqueous solution has a concentration from 0.1% to 3% by volume.

4. The method of claim 3, wherein a duration time of the first developing process is between 1 second and 100 seconds.

5. The method of claim 4, wherein a temperature of the tetramethylammonium hydroxide aqueous solution is between 22 degrees Celsius to 23 degrees Celsius.

6. The method of claim 1, wherein the negative photoresist layer has a thickness between 40 nm and 1000 nm.

7. The method of claim 1, wherein the organic developing solution is an n-butanol solution.

8. The method of claim 7, wherein the n-butanol solution has a concentration from 0.5% to 10% by volume.

9. The method of claim 1, further comprising performing a second heating process after the exposure process before the second developing process.

10. The method of claim 9, wherein:
    a duration time of the second heating process is between 50 seconds and 120 seconds; and
    a temperature of the second heating process is between 100 degrees Celsius and 250 degrees Celsius.

11. The method of claim 9, further comprising performing a second cooling process after the second heating process before the second developing process.

12. The method of claim 11, wherein:
    a duration time of the second cooling process is between 30 seconds and 150 seconds; and
    a temperature of the second cooling process is between 22 degrees Celsius and 24 degrees Celsius.

13. The method of claim 1, further comprising performing a second rinsing process after the first developing process and before the second developing process.

14. The method of claim 1, wherein the photolithographic pattern comprises a via hole.

15. The method of claim 1, wherein the photolithographic pattern comprises a trench.

16. The method of claim 1, further comprising forming an anti-reflective coating layer between the substrate and the negative photoresist layer.

17. The method of claim 1, wherein after performing the exposure process on the portion of the negative photoresist layer to form the exposed region, an area size of the top surface of the unexposed region is smaller than an area size of a bottom surface of the unexposed region.

* * * * *